(12) United States Patent
Oku

(10) Patent No.: US 7,411,275 B2
(45) Date of Patent: *Aug. 12, 2008

(54) SEMICONDUCTOR DEVICE COMPRISING AN INORGANIC INSULATING FILM AND METHOD OF MANUFACTURING THE SAME

(75) Inventor: Yoshiaki Oku, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 70 days.

This patent is subject to a terminal disclaimer.

(21) Appl. No.: 10/482,628

(22) PCT Filed: Jun. 27, 2002

(86) PCT No.: PCT/JP02/06507

§ 371 (c)(1),
(2), (4) Date: Jul. 6, 2004

(87) PCT Pub. No.: WO03/003450

PCT Pub. Date: Jan. 9, 2003

(65) Prior Publication Data

US 2004/0242020 A1    Dec. 2, 2004

(30) Foreign Application Priority Data

Jun. 29, 2001    (JP) ............................. 2001-198963

(51) Int. Cl.
*H01L 23/58* (2006.01)

(52) U.S. Cl. ............... 257/632; 257/758; 257/E21.273; 257/E23.112; 438/778

(58) Field of Classification Search ................ 257/632, 257/E21.273, 759, E23.112; 438/778
See application file for complete search history.

(56) References Cited

U.S. PATENT DOCUMENTS 5,494,858 A * 2/1996 Gnade et al. ................ 438/781
5,858,457 A   1/1999 Brinker et al.

(Continued)

FOREIGN PATENT DOCUMENTS

JP    2000-183056    6/2000

(Continued)

OTHER PUBLICATIONS

Hiroki Arao, "Tokushu Shinzairyo-Shin-Process ni yoru Handotai Hakumaku Keisei Gijutsu—Kakusha no Low-k Zairyo no Kosei to Tokucho" IPS Shokubai Kagaku Kogyo, Denshi Zairyo, May 2001, vol. 40, No. 5, pp. 98-100.

(Continued)

*Primary Examiner*—Howard Weiss
*Assistant Examiner*—John C Ingham
(74) *Attorney, Agent, or Firm*—Hamre, Schumann, Mueller & Larson, P.C.

(57) ABSTRACT

It is an object to provide an insulating film having a very low dielectric constant and a great mechanical strength. Moreover, it is another object to provide a semiconductor device capable of reducing both a capacity between wiring layers and a capacity between wirings also in microfabrication and an increase in integration in the semiconductor device. In order to attain the objects, there is provided an inorganic insulating film comprising a porous structure having a skeletal structure in which a vacancy is arranged periodically and a large number of small holes are included.

8 Claims, 8 Drawing Sheets

U.S. PATENT DOCUMENTS 6,365,266 B1 * 4/2002 MacDougall et al. .... 428/304.4
6,399,177 B1 * 6/2002 Fonash et al. ............... 428/119

FOREIGN PATENT DOCUMENTS

JP 2001-332543 11/2001

OTHER PUBLICATIONS

Hiroyuki Yamakawa, et al. "300/mm/130nm Taio no Handotai Seizo Sochi Low-k Integration", Denshi Zairyo, Mar. 2001, vol. 40, No. 3, pp. 53-61.

Kazuhiko Omote, et al. "X-Sen ni yoru Tokoshitsu Low-k Maku no Kuko Sokutei, Tokushu Shinzairyo-Shin-Process ni yoru Handotai Hakumaku Keisei Gijutsu X-Sen ni yoru Takoshitsu Low-k Maku no Kuko Skotei", Denshi Zairyo, May 2001, vol. 40, No. 5, pp. 56-60; Fig. 1.

Chiaki Tanaka et al. "Shingata Low-k Zairyo (ISM-1.5) no Kaihatsu", ULVAC Technical Journal, No. 54, Mar. 23, 2001, pp. 1-3.

Yin, et al., "Plasmon energy shift in mesoporous and double length-scale ordered nanoporous silica", Applied Physics Letters, vol. 74, No. 18, May 3, 1999, pp. 2629-2631.

Lu, et al., "Continuous formation of supported cubic and hexagonal mesoporous films by sol-gel dip-coating", Nature, vol. 389, Sep. 25, 1997, pp. 364-368.

Sellinger, et al., "Continuous self-assembly of organic-inorganic nanocomposite coatings that mimic nacre", Nature, vol. 394, Jul. 16, 1998, pp. 257-260.

* cited by examiner

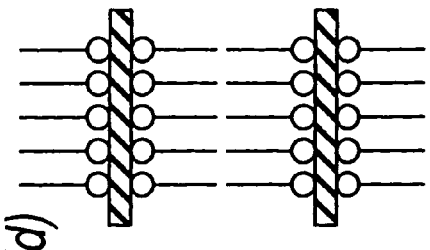
FIG. 4(d)
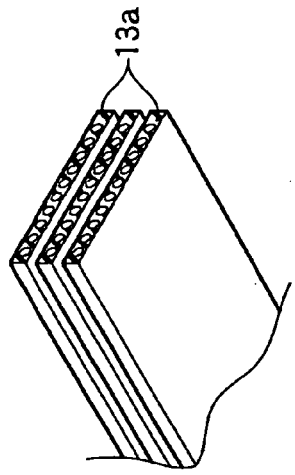
FIG. 4(f)
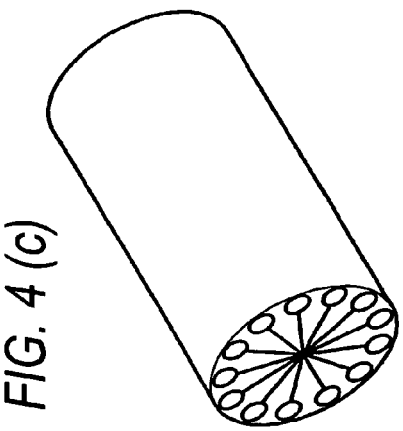
FIG. 4(b)  FIG. 4(c)
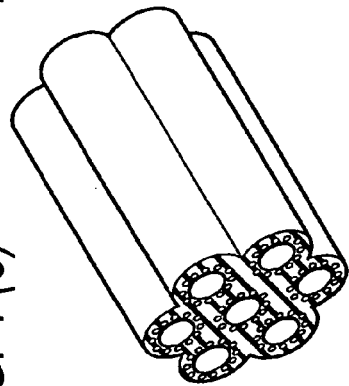
FIG. 4(e)
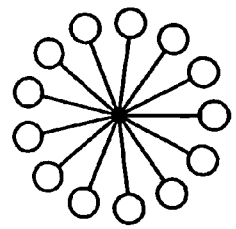
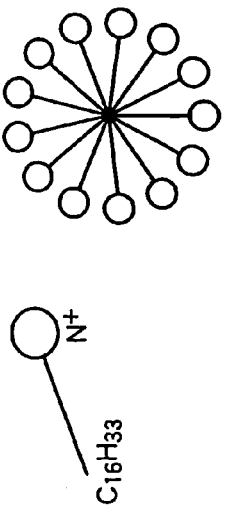
FIG. 4(a)

SEMICONDUCTOR DEVICE COMPRISING AN INORGANIC INSULATING FILM AND METHOD OF MANUFACTURING THE SAME

TECHNICAL FIELD

The present invention relates to a semiconductor device and a method of manufacturing the semiconductor device, and more particularly to an inorganic dielectric film having a low dielectric constant.

BACKGROUND ART

In order to increase a speed and to reduce power consumption in a semiconductor device, it is an important object to decrease the dielectric constant of an interlayer insulating film. Various designs have been made in order to decrease the dielectric constant. In a conventional semiconductor device, there have been proposed methods of:

(1) adding fluorine to a silica film to be an inorganic insulating film;

(2) forming an organic insulating material having a low dielectric constant as a host material; and (3) intentionally forming a porous film.

In the method (1), however, the fluorine can be added in an element ratio of approximately several % at most because the heat resistance of the insulating film is deteriorated. For this reason, there is a problem in that a specific dielectric constant can be reduced by only 10% to 15% as compared with a conventional silica based interlayer insulating film.

In the method (2), moreover, a moisture resistance and a mechanical strength are deteriorated more remarkably as compared with the conventional silica based interlayer insulating film because of an organic material. Consequently, there is a problem in that the reliability of a semiconductor device is deteriorated.

In the method (3), furthermore, a porous structure is random. Therefore, the mechanical strength of an interlayer insulating film is remarkably reduced so that the interlayer insulating film is apt to be broken in packaging. For this reason, the reliability of the semiconductor device is deteriorated.

In many cases, moreover, the porous structure is not closed. If the porous structure is not closed, the moisture resistance of the interlayer insulating film is remarkably reduced so that the reliability of the semiconductor device is deteriorated.

With microfabrication and an increase in integration in a semiconductor device, furthermore, a capacity between wirings raises serious problems in addition to a capacity between wiring layers.

In the conventional insulating film, thus, a dielectric constant cannot fully be decreased. Moreover, there is a problem in that a mechanical strength cannot sufficiently be obtained.

SUMMARY OF THE INVENTION

The invention has been made in consideration of the actual circumstances and has an object to provide an insulating film having a low dielectric constant and a great mechanical strength.

Furthermore, the invention has an object to provide a semiconductor device capable of reducing both a capacity between wiring layers and a capacity between wirings in microfabrication and an increase in integration in the semiconductor device.

The invention provides a semiconductor device comprising an inorganic insulating film formed on a surface of a substrate and having a periodic porous structure which includes vacancies having two kinds of different sizes or more, at least the vacancy having a first size being arranged periodically.

Moreover, it is desirable that the inorganic insulating film should include the vacancies having first and second sizes, the vacancy having the second size being arranged randomly.

Furthermore, it is desirable that the inorganic insulating film should have a composite periodic porous structure which includes the vacancies having first and second sizes, both of the vacancies having the first and second sizes being arranged periodically.

According to such a structure, there are included the vacancies in various sizes to have the periodic porous structure in which at least the vacancy having the first size is arranged periodically. Consequently, more vacancies can be included. The dielectric constant of air is low. Therefore, the dielectric constant can be reduced considerably and the dielectric constant of the insulating film can be reduced extremely. Moreover, there are plural kinds of periodic porous structures. Therefore, the opening portions of pores can be closed each other in the domain so that a mechanical strength can be increased. Thus, it is possible to obtain an insulating film having a high reliability.

Moreover, it is desirable that the inorganic insulating film should be obtained by repetitively arranging a first porous structure domain comprising a skeletal structure in which a cylindrical vacancy is arranged periodically and a large number of small holes are included and a second porous structure domain comprising a skeletal structure in which a layered vacancy is arranged periodically in a perpendicular direction to the surface of the substrate and a large number of small holes are included.

According to such a structure, the skeletal structure having the small holes is employed, more vacancies can be included and the dielectric constant can further be reduced. By repetitively arranging the first porous structure domain having the cylindrical vacancy provided periodically and the second porous structure domain having the layered vacancy provided periodically in a perpendicular direction to the surface of the substrate, moreover, the vacancy can have such a closed structure as to have no opening portion for an upper wiring and a lower wiring in the case in which the inorganic insulating film is particularly used as an interlayer insulating film. Thus, the inorganic insulating film can serve as a thin film having a low dielectric constant which is excellent in a moisture resistance, has a high reliability and is effective. Moreover, it is possible to obtain a uniform electrical characteristic.

Furthermore, the porous structure is oriented in a direction which is varied for each domain. Consequently, the opening portions of the vacancies can be closed each other. Thus, it is possible to obtain a thin film which has a great moisture resistance to be almost equivalent to the moisture resistance of a minute film, is also excellent in a mechanical strength because of the periodic structure and has an ultimately low dielectric constant. Moreover, a space between layers is supported on the adjacent layers. Consequently, the layered periodic porous shape to be usually supposed to be unstable can be constructed stably with a great mechanical strength.

In addition, it is desirable that the inorganic insulating film should be obtained by repetitively laminating, in parallel with the surface of the substrate, a first porous structure domain layer comprising a skeletal structure in which a cylindrical vacancy is arranged periodically and a large number of small holes are included and a second porous structure domain layer in which a layered vacancy is arranged periodically in parallel with the surface of the substrate and a large number of small holes are included.

According to such a structure, in addition to the effects described above, in the case in which the inorganic insulating film is to be particularly used as an interlayer insulating film, the vacancy can have such a closed structure as to have no opening portion with respect to the upper wiring and the lower wiring. Thus, the inorganic insulating film can serve as a thin film having a low dielectric constant which is excellent in a moisture resistance, has a very high reliability and is effective.

Moreover, it is desirable that the inorganic insulating film should be an interlayer insulating film provided between a semiconductor substrate or a first layer wiring conductor formed on the semiconductor substrate and a second layer wiring conductor.

According to such a structure, the insulating film having a low capacity can be formed. Therefore, a parasitic capacitance can be reduced and the speed of a semiconductor device can be increased.

It is desirable that the interlayer insulating film should include a first interlayer insulating film region which is formed on the first layer wiring conductor and has a contact hole to come in contact with the first layer wiring conductor and a second interlayer insulating film to be filled in a wiring region of the second layer wiring conductor formed on the first interlayer insulating film, the first interlayer insulating film being constituted by a second porous structure domain having a skeletal structure in which a layered vacancy is arranged periodically and a large number of small holes are included.

According to such a structure, there is constituted the second porous structure domain having the skeletal structure in which the layered vacancy is arranged periodically in a region surrounding the contact hole and a large number of small holes are provided. Consequently, it is possible to further reduce the capacity between the layers.

Moreover, it is desirable that the interlayer insulating film should include a first interlayer insulating film formed on the first layer wiring conductor and having a contact hole to come in contact with the first layer wiring conductor, and a second interlayer insulating film to be filled in a wiring region of the second layer wiring conductor formed on the first interlayer insulating film, the first interlayer insulating film being constituted by a second porous structure domain having a skeletal structure in which a layered vacancy is arranged periodically and a large number of small holes are included and the second interlayer insulating film being constituted by a first porous structure domain having a skeletal structure in which a cylindrical vacancy is arranged periodically and a large number of small holes are included.

According to such a structure, there is constituted the second porous structure domain having the skeletal structure in which the layered vacancy is arranged periodically in the region surrounding the contact hole and a large number of small holes are provided. Consequently, the capacity between the layers can be reduced considerably. On the other hand, the cylindrical vacancy is arranged in a line direction in an upper layer wiring region constituting an insulating film between lines. Therefore, a capacity in the line direction can be reduced more considerably. Moreover, it is desirable to use the first porous structure domain in which the direction of the array of the cylindrical vacancy is orientated in parallel with the direction of a wiring. Consequently, it is possible to provide a semiconductor device having a high reliability without a problem of a short circuit between the wirings.

Moreover, it is desirable that the interlayer insulating film should include a first interlayer insulating film formed on the first layer wiring conductor and having a contact hole to come in contact with the first layer wiring conductor, and a second interlayer insulating film to be filled in a wiring region of the second layer wiring conductor formed on the first interlayer insulating film, the first interlayer insulating film being constituted by a second porous structure domain having a skeletal structure in which a layered vacancy formed in parallel with the surface of the substrate is arranged periodically and a large number of small holes are included and the second interlayer insulating film being constituted by a third porous structure domain having a skeletal structure in which a layered vacancy formed almost perpendicularly to the surface of the substrate is arranged periodically and a large number of small holes are included.

According to such a structure, there is constituted the second porous structure domain having the skeletal structure in which the layered vacancy is arranged periodically in the region surrounding the contact hole in parallel with the surface of the substrate and a large number of small holes are included. Consequently, the capacity between the layers can be reduced considerably. On the other hand, the layered vacancy is arranged periodically almost perpendicularly to the surface of the substrate in an upper layer wiring region constituting the insulating film between lines. Therefore, a capacity in the line direction can be reduced still more. Moreover, it is possible to provide a semiconductor device having a high reliability without a problem of a short circuit between wirings.

In a method of manufacturing a semiconductor device according to the invention, the step of manufacturing an interlayer insulating film comprises the step of generating a precursor solution to contain a silica derivative including a siloxane skeleton having a six-membered ring or more and a surfactant and to have such a composition ratio that a vacancy is arranged periodically, the precrosslinking step of raising a temperature of the precursor solution to start a crosslinking reaction, the contact step of causing the precursor solution starting to be crosslinked at the precrosslinking step to come in contact with a surface of a substrate, and the step of burning the substrate with which the precursor solution is caused to come in contact and decomposing and removing the surfactant, thereby forming an insulating film.

According to such a method, the silica derivative including a siloxane skeleton having a six-membered ring or more is used. Therefore, the skeletal structure itself is formed to have small holes. Thus, it is possible to further reduce the dielectric constant while maintaining the mechanical strength.

In a method of manufacturing a semiconductor device according to the invention, moreover, the step of manufacturing an interlayer insulating film comprises the step of generating a precursor solution to contain a silica derivative including a siloxane skeleton having a six-membered ring or more and a surfactant and to have such a composition ratio that a vacancy is arranged periodically, the contact step of causing the precursor solution to come in contact with a surface of a substrate, the precrosslinking step of raising a temperature of the precursor solution to start a crosslinking reaction, and the step of burning the substrate and decomposing and removing the surfactant, thereby forming an insulating film.

According to such a method, the silica derivative including a siloxane skeleton having a six-membered ring or more is used. Therefore, the skeletal structure itself is formed to have small holes. Thus, it is possible to further reduce the dielectric constant while maintaining the mechanical strength.

Furthermore, the invention provides a method comprising the step of generating a first precursor solution to contain a silica derivative including a siloxane skeleton having a six-membered ring or more and a surfactant and to have such a first composition ratio that a vacancy is arranged periodically, the step of generating a second precursor solution to contain a silica derivative including a siloxane skeleton having a six-membered ring or more and a surfactant and to have such a second composition ratio that a vacancy is arranged periodically, the precrosslinking step of raising temperatures of the first and second precursor solutions to start a crosslinking reaction, the contact step of causing the first and second precursor solutions starting to be crosslinked at the precrosslinking step to come in contact with a surface of a substrate, and the step of burning the substrate with which the first and second precursor solutions are caused to come in contact and decomposing and removing the surfactant, thereby forming an insulating film.

According to such a structure, it is possible to further reduce the dielectric constant while maintaining the mechanical strength. Thus, it is possible to provide an insulating film having a very high controllability, a great mechanical strength and an ultimately low dielectric constant. Moreover, it is possible to easily form the interlayer insulating film having two kinds of different periodic structures or more, for example, the interlayer insulating film obtained by repetitively laminating, in parallel with the surface of the substrate, the first porous structure domain layer having the cylindrical vacancy arranged periodically and the second porous structure domain layer having the layered vacancy arranged periodically in parallel with the surface of the substrate.

Moreover, the formation can be carried out at a low temperature. Also in case of use for the interlayer insulating film of an integrated circuit, therefore, it is possible to form an insulating film having a high reliability without influencing a substrate. The insulating film can be formed without executing the heating step at 500° C. or more. Also in the case in which an aluminum wiring is to be used, therefore, the invention can be applied.

Furthermore, the insulating film can be formed by the contact of a liquid. Consequently, it is also possible to form a pattern with high precision in a minute region. Thus, the reliability can be enhanced.

Moreover, it is possible to properly change the degree of a vacancy by regulating the concentration of the precursor solution. Thus, it is possible to form an insulating thin film having a desirable dielectric constant with a very high workability.

Furthermore, the method according to the invention is characterized in that the first and second precursor solutions are caused to come in contact with the surface of the substrate and the precrosslinking reaction is then started.

According to the invention, it is possible to form the inorganic insulating film in which the vacancy is formed with two kinds of periodicities or more easily and efficiently.

It is desirable that the substrate should be repetitively immersed sequentially in the first and second precursor solutions at the contact step.

According to such a structure, it is possible to form, with a high productivity, the insulating film having a low dielectric constant in which different porous structure domains are laminated.

Moreover, it is desirable that the contact step should include the step of immersing the substrate in the first precursor solution and pulling up the substrate at a desirable speed and the step of immersing the substrate in the second precursor solution and pulling up the substrate at a desirable speed.

Furthermore, it is desirable that the first and second precursor solutions should be repetitively applied sequentially onto the substrate at the contact step.

In addition, it is desirable that the contact step should be the spin coating step of dropping the first and second precursor solutions onto the substrate and rotating the substrate.

According to such a structure, the thickness of a film and a vacancy rate can easily be regulated and the insulating film having a low dielectric constant can be formed with a high productivity.

In the method according to the invention, moreover, it is possible to enhance the degree of the vacancy still more by selecting the silica derivative.

BRIEF DESCRIPTION OF THE DRAWINGS

FIG. 4 is an explanatory view showing an interlayer insulating film according to the first embodiment of the invention.

Figure 1:
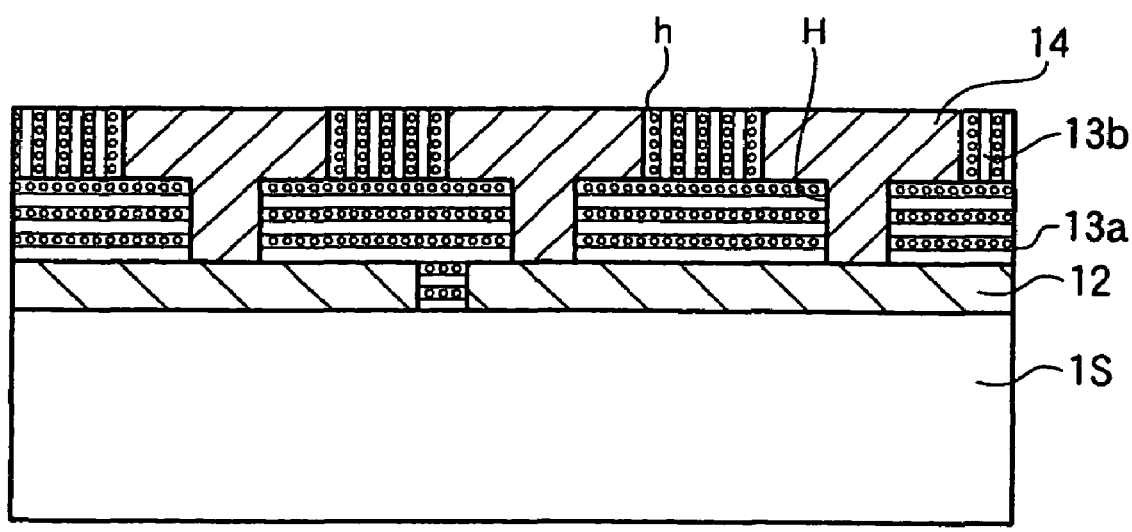
FIG. 1 is a view showing a semiconductor device having a multilayer wiring structure using an insulating film formed by a method according to a first embodiment of the invention.

In the drawings, 1S denotes a silicon substrate, 12 denotes a first wiring layer, 13a denotes a first interlayer insulating film, 13b denotes a second interlayer insulating film, 13S denotes a second interlayer insulating film, 14 denotes a second wiring layer, H denotes a contact hole, h denotes a small hole, 1 denotes a silicon substrate, 2 denotes an isolating film, 3 denotes a gate insulating film, 4 denotes a gate electrode, 5 denotes a source region, 6 denotes a drain region, 7 denotes an insulating film, 8 denotes a contact hole, 9 denotes a lower electrode, 10 denotes a ferroelectric film, and 11 denotes an upper electrode.

BEST MODE FOR CARRYING OUT THE INVENTION

A semiconductor device and a method of manufacturing the semiconductor device according to an embodiment of the invention will be described in detail with reference to the drawings.

First Embodiment

As a first embodiment of the invention, description will be given to a semiconductor device having a multilayer wiring structure using, as an interlayer insulating film, a thin film having a low dielectric constant which comprises a skeletal structure including a large number of small holes.

As shown in FIG. 1, the semiconductor device is characterized in that an interlayer insulating film is constituted by an insulating film having a low dielectric constant in a two-layer structure, a first interlayer insulating film 13a having a contact hole H to come in contact with a first wiring layer 12 is constituted by a second porous structure domain having a skeletal structure in which a layered vacancy is arranged periodically in parallel with the surface of a substrate and a large number of small holes are included, and a second interlayer insulating film 13b to be filled in the wiring region of a second wiring layer 14 on the upper layer side which is formed on the first interlayer insulating film 13a is constituted by a first porous structure domain having a skeletal structure in which a cylindrical vacancy is arranged periodically and a large number of small holes are included.

More specifically, the lower layer side of the interlayer insulating film to be formed between the first wiring layer 12 and the second wiring layer 14 which are provided on the surface of an element region surrounded by an isolating film (not shown) formed on the surface of a silicon substrate 1S is set to be the first interlayer insulating film 13a having a skeletal structure in which a layered vacancy is arranged periodically in parallel with the surface of the substrate and a large number of small holes hare included, and the second interlayer insulating film 13b to be formed as a line insulating film in the wiring pattern region of the second wiring layer on the upper layer side is constituted by the first porous structure domain having a skeletal structure in which a cylindrical vacancy is arranged periodically and a large number of small holes are included.

Although other portions are neither shown nor described, they have ordinary structures.

Referring to FIGS. 2(a) to 2(d), a process for manufacturing the interlayer insulating film will be described.

Figure 2:
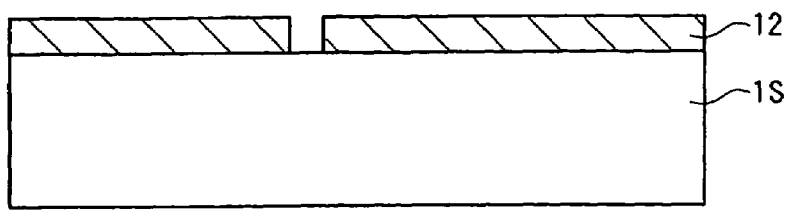
FIG. 2 is a view showing a process for manufacturing the semiconductor device having a multilayer wiring structure.
Figure 2:
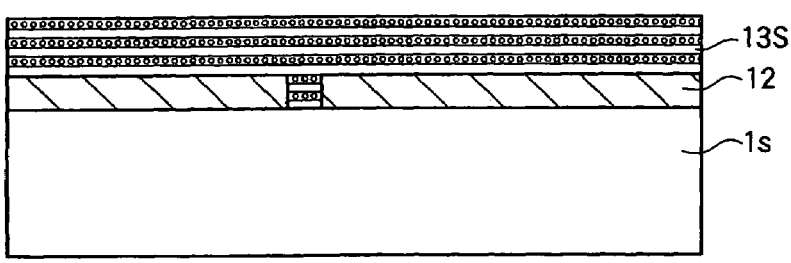
Figure 2:
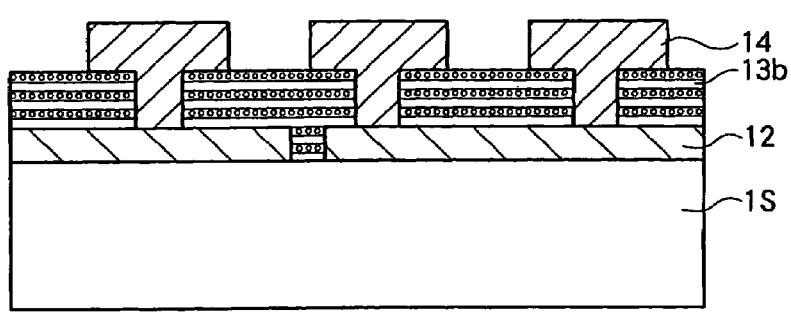
Figure 2:
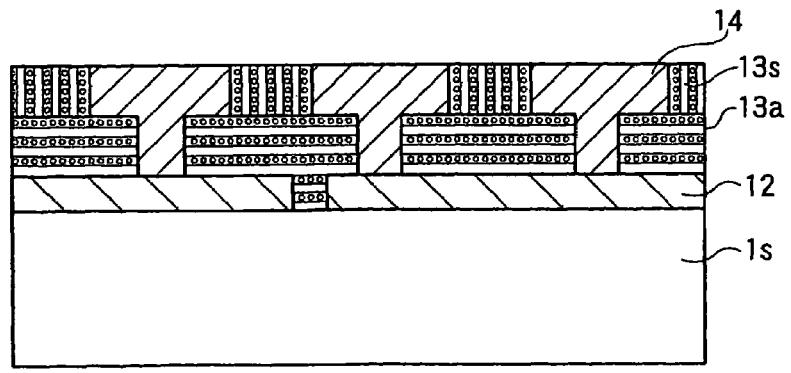

As shown in FIG. 2(a), first of all, a desirable semiconductor region is formed on the surface of a silicon substrate 1s and a first wiring layer is thus formed by an ordinary method.

Subsequently, a thin mesoporous silica film comprising a second periodic porous structure domain in which a layered vacancy is arranged periodically in parallel with the surface of the substrate is formed in parallel with the surface of the substrate by the method according to the invention (FIG. 2(b)).

Figure 3:
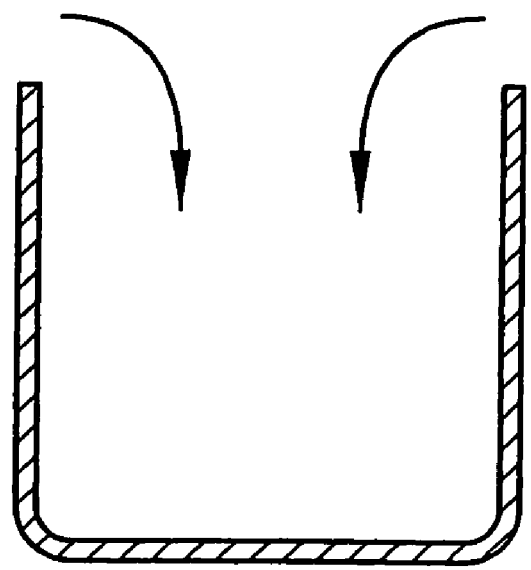
FIG. 3 is an explanatory view showing the step of forming an insulating film according to the first embodiment of the invention.
Figure 3:
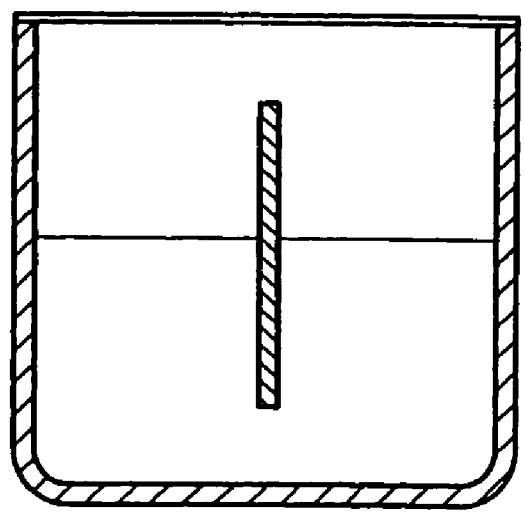

More specifically, as shown in FIG. 3(a), cation type cetyltrimethyl ammonium bromide (CTAB: $C_{16}H_{33}N^+$ $(CH_3)_3Br^-$) to be a surfactant, hydrogen silosesquioxane (HSQ: Hydrogen silosesquioxane) to be a silica derivative, and hydrochloric acid (HCl) to be an acid catalyst are first dissolved in an $H_2O$/alcohol mixed solvent, and a precursor solution is prepared in a mixing vessel. Referring to the molar ratio of preparation of the precursor solution, 0.5 of the surfactant, 0.01 of the silica derivative and 2 of the acid catalyst for 100 of the solvent are mixed, and the substrate provided with the first wiring layer 12 is immersed in the mixed solution. As shown in FIG. 3(b) then, the mixing vessel is closed tightly and is held at 30° C. to 150° C. for 1 to 120 hours. Thus, the silica derivative is polymerized by a hydrolytic polycondensation reaction (the precrosslinking step) so that the periodic autoaggregate of the surfactant is formed.

The autoaggregate forms a spherical micelle structure (FIG. 4(b)) obtained by agglutinating a plurality of molecules with $C_{16}H_{33}N^+$ $(CH_3)_3Br^-$ to be one molecule as shown in FIG. 4(a). When the degree of aggregation is enhanced with an increase in a concentration (FIG. 4(c)), a layer structure (FIG. 4(d) having a vacancy oriented is formed.

The substrate is pulled up and is washed and dried, and is then heated and burned for 3 hours in a nitrogen atmosphere at 400° C. to thermally decompose and remove the surfactant in a template completely, thereby forming a pure and thin mesoporous silica film.

As shown in FIG. 2(b), thus, the first interlayer insulating film 13a having a layered vacancy arranged in parallel with the surface of the substrate is formed. FIG. 4(f) is an enlarged explanatory view. An autoaggregate having a high concentration shown in FIG. 4(d) is formed and is burned. Consequently, it is possible to form an inorganic insulating film which has a skeletal structure including a large number of small holes and is provided with the layered vacancy.

As shown in FIG. 2(c), then, a through hole H is formed on the first interlayer insulating film 13a and the second wiring layer 14 is formed by the ordinary method.

Then, the second interlayer insulating film 13b is formed. The formation is carried out in the same manner as in the step of forming the first interlayer insulating film 13a, and only the composition of the precursor solution is changed. Referring to the molar ratio of preparation of the precursor solution, 0.05 of the surfactant, 0.1 of the silica derivative and 2 of the acid catalyst for 100 of the solvent are mixed. The formation is carried out at just the same other steps.

As shown in FIG. 2(d), thus, there is obtained the second interlayer insulating film 13b having a skeletal structure in which a cylindrical vacancy is formed periodically and a large number of small holes are included.

The concentration of the spherical micelle structure obtained by agglutinating a plurality of molecules with $C_{16}H_{33}N^+$ $(CH_3)_3Br^-$ to be one molecule is further increased. Thus, a cylindrical member having the vacancy arranged is formed and an autoaggregate shown in FIG. 4(c) is formed and burned. Consequently, there is obtained the second interlayer insulating film 13b having the first porous structure domain in which a cylindrical vacancy is arranged periodically as shown in an enlarged explanatory view of FIG. 4(e).

Figure 5:
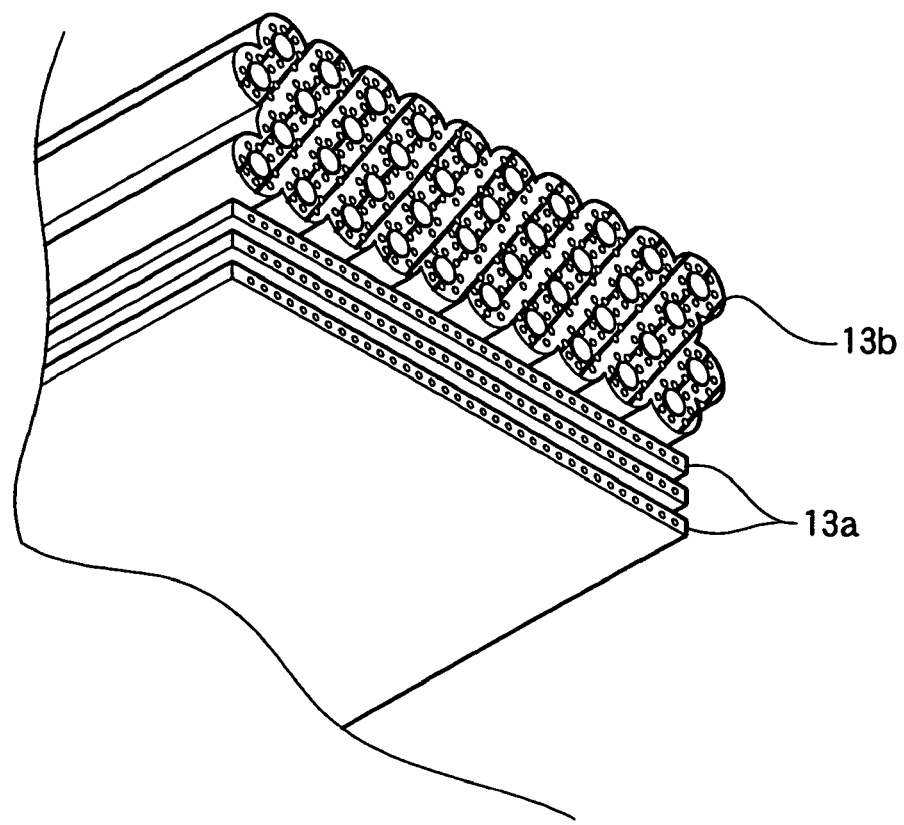
FIG. 5 is an explanatory view showing the structure of the interlayer insulating film according to the first embodiment of the invention.

FIG. 5 is an explanatory view showing the structure of a section in this state. As is apparent from FIG. 5, the interlayer insulating film is constituted by the first interlayer insulating film 13a formed by a porous thin film having a skeletal structure in which the vacancy is formed like a layer and a large number of small holes are included and the second interlayer insulating film 13b having a skeletal structure in which the cylindrical vacancy is arranged periodically and a large number of small holes are included.

In the semiconductor device having the multilayer wiring structure thus formed, the interlayer insulating film constitutes the second porous structure domain in which the layered vacancy is arranged periodically in the region surrounding the contact hole H. Consequently, a capacity between the layers can be reduced. In the upper layer wiring region constituting the line insulating film, moreover, the layered vacancy is arranged in parallel with the wirings. Consequently, a capacity in a wiring direction can be reduced. In the line insulating film to be the second interlayer insulating film on the upper layer side, the direction of the array of the cylindrical vacancy is oriented in parallel with the wiring direction of the wiring pattern of the second wiring layer 14. Therefore, it is possible to provide a semiconductor device having a high reliability without a problem of a short circuit between wirings.

Second Embodiment

While the interlayer insulating film is constituted by the insulating film having a low dielectric constant in the two-layer structure, and the lower layer side is constituted by the second porous structure domain having the layered vacancy arranged periodically in parallel with the surface of the substrate and the upper layer side is constituted by the first porous structure domain having the cylindrical vacancy arranged periodically in the first embodiment, the upper layer side may be constituted by a third porous structure domain to be provided perpendicularly to the surface of the substrate in parallel with a main wiring in place of the cylindrical vacancy.

Figure 6:
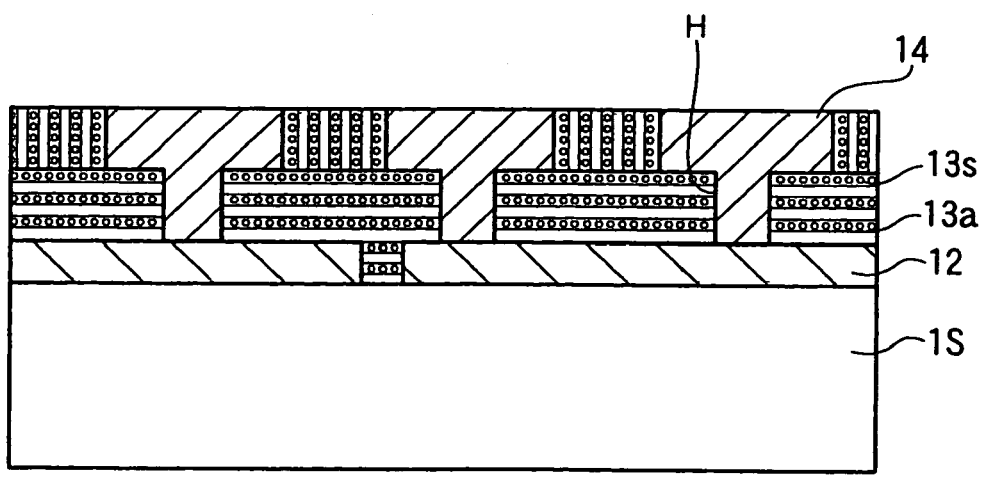
FIG. 6 is an explanatory view showing a semiconductor device according to a second embodiment of the invention.

FIG. 6 shows the structure. More specifically, as shown in FIG. 6, the semiconductor device is characterized in that an interlayer insulating film is constituted by an insulating film having a low dielectric constant in a two-layered structure, a first interlayer insulating film 13a having a contact hole H to come in contact with a first wiring layer 12 is constituted by a second porous structure domain having a skeletal structure in which a layered vacancy is arranged periodically in parallel with the surface of a substrate and a large number of small holes are included, and a second interlayer insulating film 13S to be filled in the wiring region of a second wiring layer 14 on the upper layer side which is formed on the first interlayer insulating film 13a is constituted by the third porous structure domain in which a layered vacancy to be almost perpendicular to the surface of the substrate is arranged periodically.

More specifically, the lower layer side of the interlayer insulating film to be formed between the first wiring layer 12 and the second wiring layer 14 which are provided on the surface of an element region surrounded by an isolating film (not shown) formed on the surface of a silicon substrate is is set to be the first interlayer insulating film 13a in which a layered vacancy is arranged periodically in parallel with the surface of the substrate, and the second interlayer insulating film 13S to be formed as a line insulating film in the wiring pattern region of the second wiring layer on the upper layer side is constituted by the third porous structure domain to be provided perpendicularly to the surface of the substrate in parallel with the main wiring.

Other portions are neither shown nor described and are formed in just the same manner as those in the first embodiment.

According to such a structure, a large number of vacancies are included, and furthermore, the skeletal structure having a large number of small holes is employed. Therefore, it is possible to more reduce a capacity between lines. Furthermore, the wiring is provided in parallel with the main wiring. Consequently, a multilayered insulating wall is present between the wirings and a short circuit between the wirings can also be prevented better.

Third Embodiment

As a third embodiment of the invention, description will be given to an FRAM using a thin film having a low dielectric constant as an interlayer insulating film.

Figure 7:
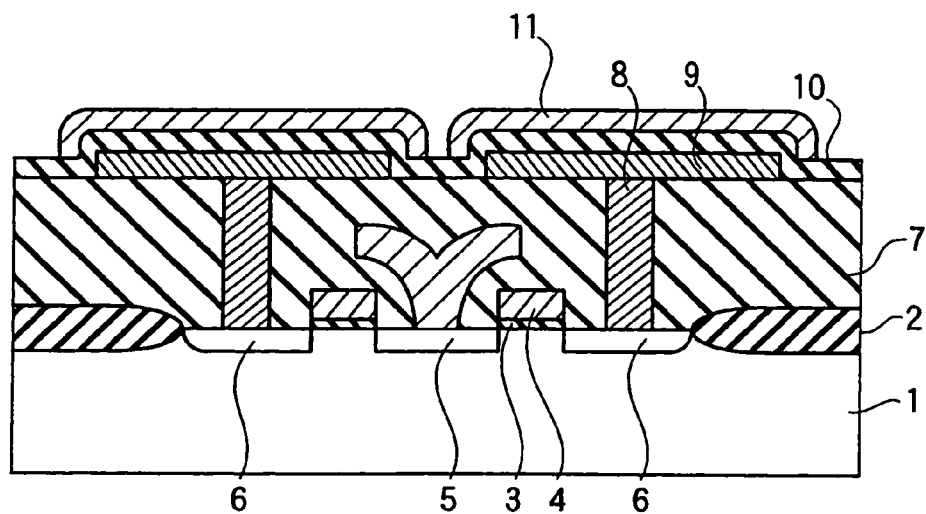
FIG. 7 is a view showing an FRAM using an insulating film formed by a method according to a third embodiment of the invention.
Figure 7:
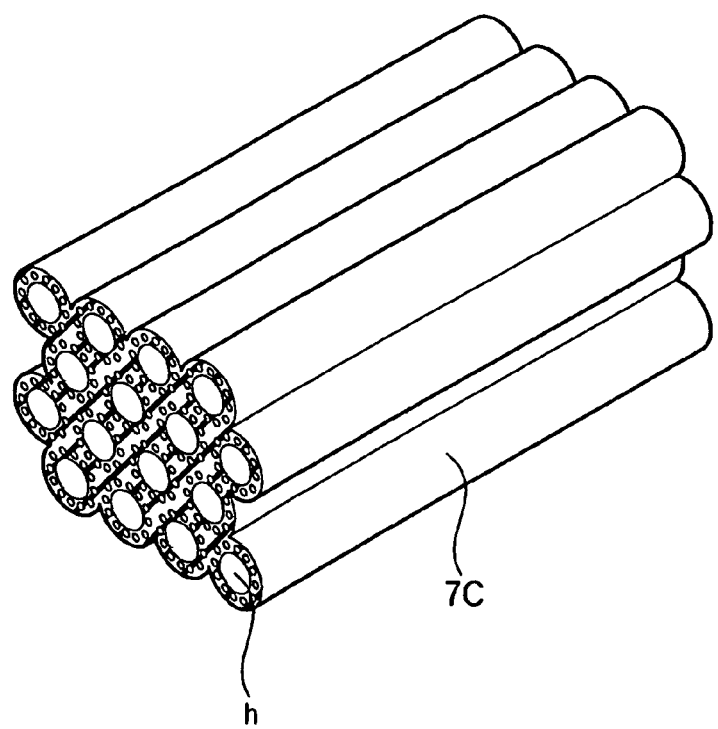

As shown in FIG. 7(a), the FRAM comprises a switching transistor formed in an element region surrounded by an isolating film 2 formed on the surface of a silicon substrate 1 and a ferroelectric capacitor and is characterized in that a thin film 7 having a low dielectric constant according to the invention is used as an interlayer insulating film between the switching transistor and a lower electrode 9 of the ferroelectric capacitor in the invention. The thin film having a low dielectric constant is characterized by a first porous structure domain 7c having a skeletal structure in which a cylindrical vacancy is arranged periodically and a large number of small holes h are included as shown in an enlarged perspective view illustrating a main part in FIG. 7(b).

According to such a structure, in addition to the effects described above, in the case in which the thin film is particularly used as the interlayer insulating film, the vacancy can have such a closed structure as to have no opening portion with respect to an upper layer wiring and a lower layer wiring. Consequently, it is possible to produce the advantages of a thin film having a low dielectric constant which is excellent in a moisture resistance, has a very high reliability and is effective.

Others are formed by an ordinary method. The switching transistor comprises a gate electrode formed on the surface of the silicon substrate 1 through a gate insulating film 3, and a source region 5 and a drain region 6 which are formed to interpose the gate electrode therebetween, and the lower electrode 9 is connected to the drain region 6 through a contact 8, while a source-drain region is connected to a bit line BL.

On the other hand, a ferroelectric capacitor is constituted by interposing a ferroelectric thin film 10 comprising PZT between the lower electrode 9 and an upper electrode 11.

Referring to FIGS. 8(a) to 8(d), description will be given to a process for manufacturing the FRAM.

Figure 8:
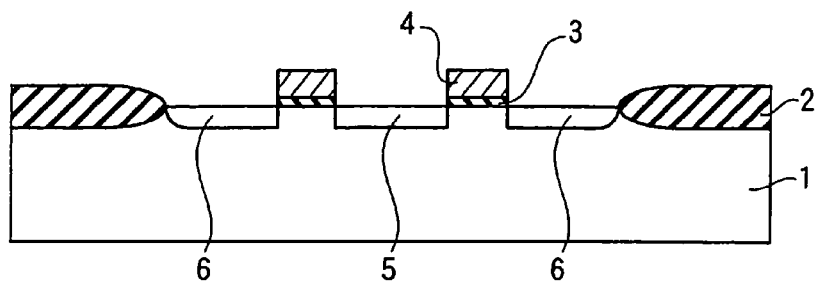
FIG. 8 is a view showing a process for manufacturing the FRAM in FIG. 7.
Figure 8:
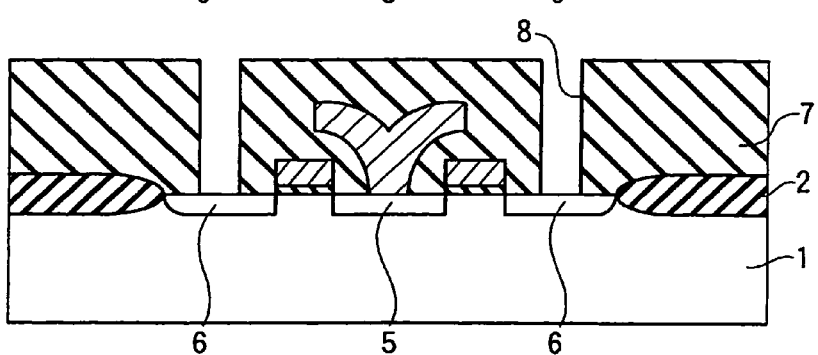
Figure 8:
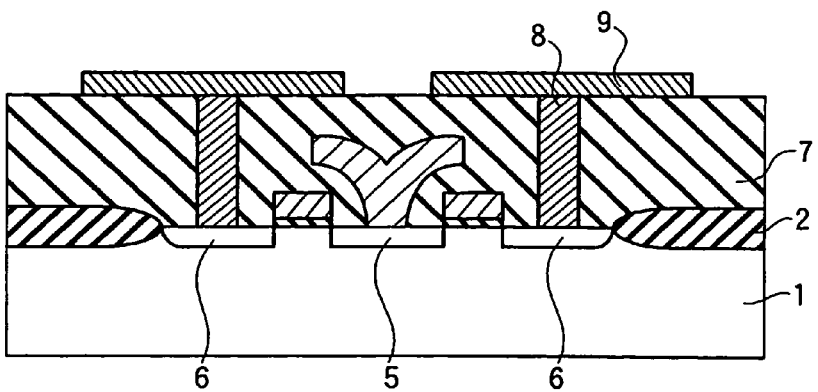
Figure 8:
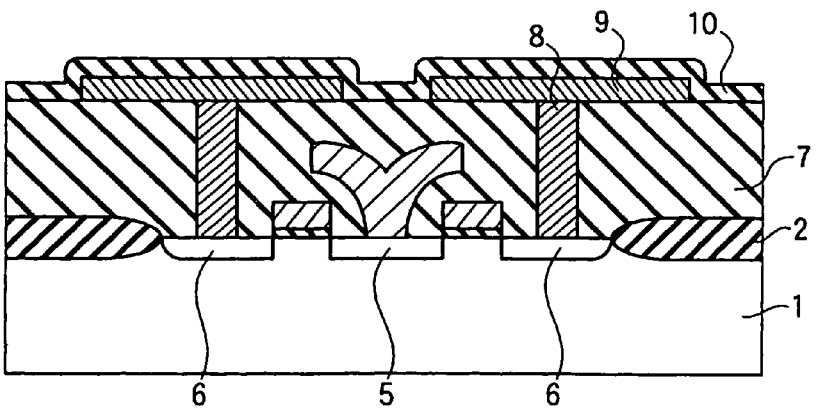

By an ordinary method, first of all, a gate electrode 4 is formed on the surface of the silicon substrate 1 through the gate insulating film 3 and an impurity is diffused by using the gate electrode 4 as a mask, thereby forming the source region 5 and the drain region 6 (FIG. 8(a)).

By the method according to the invention, subsequently, a thin mesoporous silica film is formed to include a plurality of periodic porous structure domains having a cylindrical vacancy oriented in one direction in parallel with the surface of the substrate (FIG. 8(b)).

Figure 9:
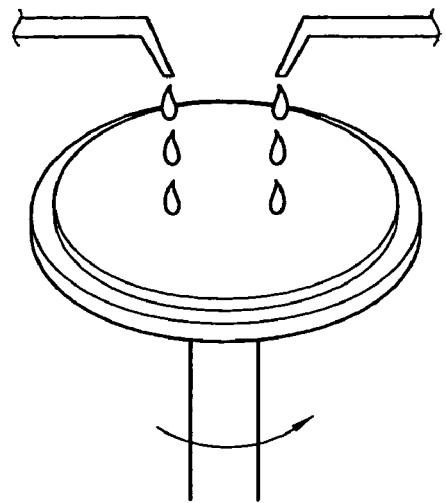
FIG. 9 is an explanatory view showing the step of forming the insulating film according to the third embodiment of the invention.

More specifically, as shown in FIG. 3(a), cation type cetyltrimethyl ammonium bromide (CTAB: $C_{16}H_{33}N^+(CH_3)_3Br^-$) to be a surfactant, methyl silsesquioxane (MSQ: Methyl silsesquioxane) to be a silica derivative, and hydrochloric acid (HCl) to be an acid catalyst are first dissolved in an $H_2O$/alcohol mixed solvent, and a precursor solution is prepared in a mixing vessel. Referring to the molar ratio of preparation of the precursor solution, there are prepared a first precursor solution mixing 0.05 of the surfactant, 0.1 of the silica derivative and 2 of the acid catalyst for 100 of the solvent and a second precursor solution mixing 0.5 of the surfactant, 5 of the silica derivative and 2 of the acid catalyst for 100 of the solvent. As shown in FIG. 9, the first and second precursor solutions thus formed are dropped from respective nozzles onto the surface of the substrate 1 mounted on a spinner and a rotation is carried out at 500 to 5000 rpm so that a thin mesoporous silica film is obtained. The silica derivative is held at 30° C. to 150 ° C. for 1 to 120 hours and is thereby polymerized by a hydrolytic polycondensation reaction (the precrosslinking step), resulting in the formation of a thin mesoporous silica film having the periodic autoaggregate of the surfactant to be a template. The precrosslinking step is desirably carried out at 60° C. to 120° C., and more desirably, at 70° C. to 90° C. for approximately 12 to 72 hours.

In the same manner as in the first embodiment, finally, burning is carried out to thermally decompose and remove the surfactant completely. Thus, a pure and thin mesoporous silica film is formed.

While the thin film 7 having a low dielectric constant according to the embodiment of the invention is thus formed, it is to be actually formed in two stages in order to provide the bit line BL. It is also possible to form an interlayer insulating film in a two-layer structure having different vacancy arrays by using precursor solutions having different composition ratios before and after the formation of the bit line BL.

While the precursor solution is applied onto the surface of the substrate and the precrosslinking is then carried out in the embodiment, it is also possible to carry out the precrosslinking and to then apply the precursor solution onto the surface of the substrate. According to such a structure, the precursor solutions are mixed with difficulty and mutual states can be maintained. Consequently, an interlayer insulating film having a plurality of periodic porous structures can be formed more easily.

As shown in FIG. 8(b), then, a contact hole 8 is formed on the thin film 7 having a low dielectric constant by an ordinary method. Thereafter, a buried plug comprising a doped polycrystalline silicon layer in a high concentration is formed in the contact hole. Subsequently, iridium is set to be a target and an iridium oxide layer is formed by using a mixed gas of argon and oxygen. Furthermore, a platinum layer is formed on the iridium oxide layer by using platinum as a target. As shown in FIG. 8(c), thus, the iridium oxide layer having a thickness of approximately 50 nm and the platinum layer having a thickness of approximately 200 nm are formed and are patterned by photolithography. Thus, the lower electrode 9 is formed.

Next, a PZT film is formed as the ferroelectric film 10 on the lower electrode 9 by a sol-gel method. A mixed solution of $Pb(CH_3COO)_2 \cdot 3H_2O$, $Zr(t-OC_4H_9)_4$ and $Ti(i-OC_3H_7)_4$ was used as a starting material. The mixed solution was subjected to spin coating and was then dried at 150° C., and was temporarily burned for 30 minutes at 400° C. in a dry air atmosphere. This operation was repeated five times and a heat treatment was carried out at 700° C. or more in an $O_2$ atmosphere. Thus, the ferroelectric film 10 having a thickness of 250 nm was formed. In $PbZr_xTi_{1-x}O_3$, x is set to be 0.52 (which will be hereinafter referred to as PZT(52/48)) and a PZT film is thus formed (FIG. 8(d)).

Furthermore, a laminated film 11 of iridium oxide and iridium is formed on the ferroelectric film 10 by sputtering. The laminated film comprising the iridium oxide layer and the iridium layer is set to be the upper electrode 11. Herein, the iridium layer and the iridium oxide layer are formed to have a thickness of 200 nm in total. Thus, a ferroelectric capacitor can be obtained and the FRAM shown in FIG. 7 can be formed.

According to such a structure, the interlayer insulating film is constituted by the thin film having a low dielectric constant which is formed by a thin mesoporous silica film. Therefore, the capacity of the interlayer insulating film can be reduced. Thus, it is possible to form an FRAM having an excellent switching characteristic and capable of carrying out a high-speed operation.

Moreover, the periodic porous structure is used. Therefore, a mechanical strength can be increased. Thus, it is possible to obtain an insulating film having a high reliability. Furthermore, the interlayer insulating film is constituted by the first porous structure domain having the skeletal structure in which the cylindrical vacancy is arranged periodically and a large number of small holes are included. Consequently, it is possible to form an insulating film having a low dielectric constant in which a mechanical strength is great. Thus, the operating speed of a device can be increased. Accordingly, the interlayer insulating film can have a long lifetime.

The composition of the first precursor solution is not restricted to the composition according to the embodiment but it is desirable that 0.01 to 0.1 of the surfactant, 0.01 to 0.5 of the silica derivative and 0 to 5 of the acid catalyst for 100 of the solvent should be used. By using the precursor solution having such a structure, it is possible to form an insulating film having a low dielectric constant which includes a cylindrical vacancy.

Moreover, the composition of the second precursor solution is not restricted to the composition according to the embodiment but it is desirable that 0.1 to 10 of the surfactant, 0.5 to 10 of the silica derivative and 0 to 5 of the acid catalyst for 100 of the solvent should be used. By using the precursor solution having such a structure, it is possible to form an insulating film having a low dielectric constant which includes a layered vacancy.

Furthermore, cation type cetyltrimethyl ammonium bromide (CTAB: $C_{16}H_{33}N^+ (CH_3)_3Br^-$) has been used as the surfactant in the embodiment, which is not restricted. It is apparent that another surfactant may be used.

If an alkali ion such as an Na ion is used as the catalyst, a semiconductor material is deteriorated. For this reason, it is desirable that a cation type surfactant should be used and an acid catalyst should be used for the catalyst. For the acid catalyst, it is also possible to use nitric acid ($HNO_3$), sulfuric acid ($H_2SO_4$), phosphoric acid ($H_3PO_4$) and $H_4SO_4$ as well as HCl.

Moreover, the silica derivative is not restricted to HSQ or MSQ but is preferably a material including a siloxane skeleton having a six-membered ring or more.

Furthermore, while the water $H_2O$/alcohol mixed solvent has been used for the solvent, only the water may be used.

Moreover, while the nitrogen atmosphere has been used for a burning atmosphere, the burning may be carried out under reduced pressure or in the air. It is desirable that a foaming gas comprising a mixed gas of nitrogen and hydrogen should be used. Consequently, a moisture resistance can be enhanced and a leakage current can be reduced.

In addition, it is possible to properly change a mixing ratio of the surfactant, the silica derivative, the acid catalyst and the solvent.

Furthermore, while the prepolymerizing step has been held at 30° C. to 150° C. for 1 to 120 hours, 60° C. to 120° C. is desirable and 90° C. is more desirable.

Moreover, while the burning step has been carried out at 400° C. for 1 hour, it may be performed at 300° C. to 500° C. for approximately 1 to 5 hours. It is desirable that 350° C. to 450° C. should be set.

Fourth Embodiment

Figure 10:
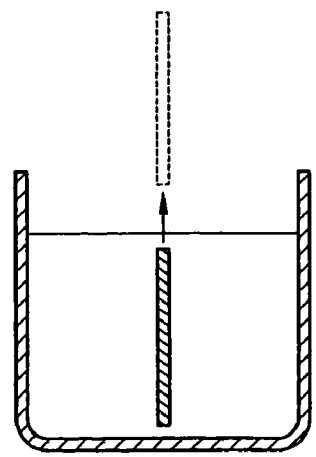
FIG. 10 is an explanatory view showing a method of forming an insulating film according to a fourth embodiment of the invention.

While the thin mesoporous silica film has been formed by the immersion in the precursor solution in the first embodiment, the formation is not restricted to the immersion but a dip coating method may be used as shown in FIG. 10.

More specifically, a substrate is brought down perpendicularly to the liquid level of a prepared precursor solution at a speed of 1 mm/s to 10 m/s and is immersed in the solution, and is then held stationarily for 1 second to 1 hour.

After a desirable time passes, the substrate is perpendicularly brought up again at the speed of 1 mm/s to 10 m/s and is then taken out of the solution.

Finally, burning is carried out in the same manner as in the first embodiment. Consequently, a surfactant is thermally decomposed and removed completely to form a pure and thin dual porous silica film.

Fifth Embodiment

Figure 11:
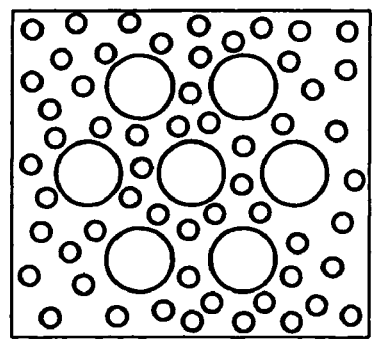
FIG. 11 is an explanatory view showing a method of forming an insulating film according to a fifth embodiment of the invention.

As a fifth embodiment of the invention, moreover, it is also effective that small holes are randomly formed between vacancies arranged periodically as shown in FIG. 11.

It is apparent that the construction of an acquired structure is changed depending on the ratio of a surfactant to a silica derivative having a six-membered ring structure when a precursor solution is to be prepared.

For example, it is apparent that a network structure (a cubic structure) is obtained when the molar ratio of the surfactant to the silica derivative, for example, CATB/MSQ is 0.3 to 0.8. When the molecular ratio is smaller, that is, 0.1 to 0.5, it is possible to obtain an insulating film having a low dielectric constant in which a cylindrical vacancy is oriented. On the other hand, when the molecular ratio is greater, that is, 0.5 to 2, it is possible to obtain an insulating film having a low dielectric constant in which a layered vacancy is oriented.

While the applying method using the spinner has been described in the embodiment, it is also possible to apply a so-called brushing method of carrying out application by means of a brush.

In addition, while the interlayer insulating film of the FRAM has been described in the embodiment, the invention can also be applied to various semiconductor devices using silicon, a high-speed device including a device using a compound semiconductor such as HEMT, a high-frequency device such as a microwave IC, an MFMIS type high integrated ferroelectric memory, a microwave transmission line using a film carrier or a multilayer wiring board.

INDUSTRIAL APPLICABILITY

As described above, according to the invention, it is possible to easily obtain an insulating film having a very low dielectric constant with a high controllability and a great mechanical strength.

Moreover, it is possible to obtain a thin film having a low dielectric constant which is particularly effective for an interlayer insulating film.

The invention claimed is:

1. A semiconductor device comprising an inorganic insulating film formed on a surface of a substrate and having a periodic porous structure having one or more layers, wherein vacancies having two kinds of different sizes or more are present together in at least one of the one or more layers of the periodic porous structure, wherein at least the vacancy having a first size is arranged periodically, and said first size is larger than that of any other kinds of the remaining vacancies, and wherein the remaining vacancies surround the vacancy having said first size in at least one of the one or more layers of the periodic porous structure.

2. The semiconductor device according to claim 1, wherein the inorganic insulating film includes the vacancies having first and second sizes, the vacancy having the second size being arranged randomly.

3. The semiconductor device according to claim 1, wherein the inorganic insulating film has a composite periodic porous structure which includes the vacancies having first and second sizes, both of the vacancies having the first and second sizes being arranged periodically.

4. The semiconductor device according to claim 1, wherein the inorganic insulating film is obtained by repetitively laminating, in parallel with the surface of the substrate, a first porous structure domain layer comprising a skeletal structure in which a cylindrical vacancy having the first size is arranged periodically and a large number of small holes are included and a second porous structure domain layer in which a layered vacancy is periodically arranged in parallel with the surface of the substrate and a large number of small holes are included.

5. The semiconductor device according to claim 1, wherein the inorganic insulating film is an interlayer insulating film provided between a semiconductor substrate or a first layer wiring conductor formed on the semiconductor substrate and a second layer wiring conductor formed thereon.

6. The semiconductor device according to claim 5, wherein the interlayer insulating film includes a first interlayer insulating film which is formed on the first layer wiring conductor and has a contact hole to come in contact with the first layer wiring conductor and a second interlayer insulating film to be filled in a wiring region of the second layer wiring conductor formed on the first interlayer insulating film, the first interlayer insulating film being constituted by a second porous structure domain having a skeletal structure in which a layered vacancy is arranged periodically and a large number of small holes are included.

7. The semiconductor device according to claim 5, wherein the interlayer insulating film comprises:
a first interlayer insulating film formed on the first layer wiring conductor and having a contact hole to come in contact with the first layer wiring conductor; and
a second interlayer insulating film to be filled in a wiring region of the second layer wiring conductor formed on the first interlayer insulating film,
the first interlayer insulating film being constituted by a second porous structure domain having a skeletal structure in which a layered vacancy is arranged periodically and a large number of small holes are included and the second interlayer insulating film being constituted by a first porous structure domain having a skeletal structure in which a cylindrical vacancy is arranged periodically and a large number of small holes are included.

8. The semiconductor device according to claim 5, wherein the interlayer insulating film comprises:
a first interlayer insulating film formed on the first layer wiring conductor and having a contact hole to come in contact with the first layer wiring conductor; and
a second interlayer insulating film to be filled in a wiring region of the second layer wiring conductor formed on the first interlayer insulating film,
the first interlayer insulating film being constituted by a second porous structure domain having a skeletal structure in which a layered vacancy formed in parallel with the surface of the substrate is arranged periodically and a large number of small holes are included and the second interlayer insulating film being constituted by a third porous structure domain having a skeletal structure in which a layered vacancy formed almost perpendicularly to the surface of the substrate is arranged periodically and a large number of small holes are included.

* * * * *